United States Patent [19]
Feldmann et al.

[11] Patent Number: 5,867,416
[45] Date of Patent: Feb. 2, 1999

[54] EFFICIENT FREQUENCY DOMAIN ANALYSIS OF LARGE NONLINEAR ANALOG CIRCUITS USING COMPRESSED MATRIX STORAGE

[75] Inventors: Peter Feldmann, Short Hills; David Esley Long, Chatham; Robert C. Melville, New Providence, all of N.J.

[73] Assignee: Lucent Technologies Inc., Murray Hill, N.J.

[21] Appl. No.: 832,487

[22] Filed: Apr. 2, 1997

Related U.S. Application Data

[60] Provisional application No. 60/014,689 Apr. 2, 1996 and provisional application No. 60/032,388 Dec. 4, 1996.

[51] Int. Cl.[6] .................................................. G06F 17/00
[52] U.S. Cl. .................... 364/807; 364/725.01; 364/735; 364/748.2
[58] Field of Search .............................. 364/725.01, 735, 364/748.2, 807

[56] References Cited

PUBLICATIONS

1. K.S. Kundert, J.K. White and A. Sangiovanni–Vincentelli, "Steady–State Methods for Simulating Analog and Microwave Circuits," Kluwer, Boston, MA, pp. 91–93, 124–132, 1990.

2. V. Rizzoli, C. Cecchetti, A. Lipparini and F. Mastri, "General–Purpose Harmonic Balance Analysis of Nonlinear Microwave Circuits Under Multitone Excitation," IEEE Trans. Microwave Theory and Tech., vol. MTT–36, No. 12, pp. 1650–1660, Dec. 1988.

3. V. Rizzoli, F. Mastri, F. Sgallari and C. Frontini, "The Exploitation of Sparse Matrix Techniques in Conjuction with the Piece–Wise Harmonic Balance Method for Nonlinear Microwave Circuit Analysis," IEEE MTT–S Int. Microwave Symp. Digest, Dallas, TX, pp. 1295–1298, May 1990.

4. D. Long, R. Melville, K. Ashby and B. Horton, "Full–chip Harmonic Balance," Proceedings of the IEEE Custom Integrated Circuits Conference, May 1997.

5. P. Feldmann, R. Melville and D. Long, "Efficient Frequency Domain Analysis of Large Non–Linear Analog Circuits," Proceedings of the IEEE Custom Integrated Circuits Conference, May 1996.

6. R. Melville, P. Feldmann and J. Roychowdhury, "Effiecient Multi–Tone Distortion Analysis of Analog Integrated Circuits," Proceedings of the IEEE Custom Integrated Circuit Conference, May 1995.

7. M. Rösch and K. Antreich, "Schnelle Stationare Simulation Nichtlinearer Schaltungen im Freuenzebereich," AEU, vol. 46, No. 3, pp.168–176, 1992.

8. M. Rösch, "Schnelle Simulation des Stationären Verhaltens Nichtlinearer Schaltungen," Dissertation, Technical University of Munich, 1992.

(List continued on next page.)

*Primary Examiner*—Krisna Lim

[57] ABSTRACT

Methods and apparatus for performing frequency domain analysis using compressed matrix storage to reduce the computation and storage requirements associated with processing a system of harmonic balance equations. A nonlinear circuit, system or other device to be analyzed includes n unknown node spectra, each characterized by N spectral coefficients in the system of harmonic balance equations. A compressed version of a Jacobian matrix J representing the system of harmonic balance equations is generated by forming m sequences of length N using one or more block-diagonal matrices associated with the Jacobian matrix J, converting each of the m sequences to the frequency domain using a discrete Fourier transform, such that a set of Fourier coefficients are generated for each of the m sequences, and storing only those Fourier coefficients which exceed a threshold as the compressed version of the Jacobian matrix J. Information generated from an inverse transform of the compressed version is utilized to solve a preconditioned linear system $\tilde{J}^{-1}JZ=\tilde{J}^{-1}W$ which is based on an approximation $\tilde{J}$ of the Jacobian matrix J.

38 Claims, 5 Drawing Sheets

PUBLICATIONS

9. B. Troyanovsky, Z. Yu, L. So and R.W. Dutton, "Relaxation–Based Harmonic Balance Technique for Semiconductor Device Simulation," Proceeding of the IEEE/ACM International Conference on Computer–Aided Design, pp. 700–703, Nov. 1995.

10. H.G. Brachtendorf, G. Welsch, R. Laur and A. Buse–Gerstner, "Numerical Steady State Analysis of Electronic Circuits Driven by Multi–Tone Signals," Electrical Engineering 79, pp. 103–112, Springer–Verlag, 1996.

11. H.G. Brachtendorf, G. Welsch, and R. Laur, "A Simulation Tool for the Analysis and Verification of the Steady State of Circuit Designs," International Journal of Circuit Theory and Applications, vol, 23, pp. 311–323, 1995.

12. K.S. Kundert and A. Sangiovanni–Vincentelli, "Simulation of Nonlinear Circuits in the Frequency Domain," IEEE Transactions on Computer–Aided Design, vol. CAD–5, No. 4, pp. 521–535, Oct. 1986.

13. V. Rizzoli, A. Lipparini, A. Costanzo, F. Mastri, C. Cecchetti, A. Neri and D. Masotti, "State of the Art Harmonic Balance Simulation of Forced Nonlinear Microwave Circuits by the Piecewise Technique," IEEE Trans. Microwave Theory and Tech., vol. 40, No. 1, pp. 12–28, Jan. 1992.

14. V. Rizzoli, A. Costanzo, P.R. Ghigi, F. Mastri, D. Masotti and C. Cecchetti, "Recent Advances in Harmonic–Balance techniques for Nonlinear Microwave Circuit Simulation," AEU, vol. 46, No. 4, pp.286–297, 1992.

EFFICIENT FREQUENCY DOMAIN ANALYSIS OF LARGE NONLINEAR ANALOG CIRCUITS USING COMPRESSED MATRIX STORAGE

RELATED APPLICATIONS

The present application claims the benefit of U.S. Provisional Application No. 60/014,689, filed Apr. 2, 1996 and entitled "Efficient Frequency Domain Analysis of Large Nonlinear Analog Circuits," and U.S. Provisional Application No. 60/032,388, filed Dec. 4, 1996 and entitled "Low-Displacement Rank Preconditioners for Periodic and Quasi-Periodic Boundary Value Problems."

FIELD OF THE INVENTION

The present invention relates generally to frequency domain analysis techniques for large nonlinear integrated circuits, and more particularly to the use of compressed matrix storage to reduce the storage and computation requirements associated with the inversion and other processing of a harmonic balance matrix.

BACKGROUND OF THE INVENTION

A technique known as "harmonic balance" is commonly used to provide fast and accurate steady-state analysis of nonlinear circuits. The harmonic balance technique is particularly well-suited for analysis of nonlinear circuits driven by two or more periodic inputs at widely separated frequencies. Unlike other conventional analysis techniques, the computation time required for a harmonic balance analysis is substantially insensitive to the actual numeric values of the stimuli frequencies. The harmonic balance technique generally involves expressing each of n circuit node waveforms as a Fourier series truncated to N coefficients, then replacing the differential equations describing the circuit operation with a system of nonlinear algebraic equations involving the Fourier coefficients. This replacement is possible because the derivative with respect to time of a Fourier series is an algebraic operation. A numerical technique, such as Newton's method, is then employed to solve the resulting system of nonlinear equations. Additional details regarding the harmonic balance technique may be found in, for example, K. S. Kundert, J. K. White and A. Sangiovanni-Vincentelli, "Steady-State Methods for Simulating Analog and Microwave Circuits," Kluwer, Boston, Mass., 1990; R. J. Gilmore and M. B. Steer, "Nonlinear Circuit Analysis Using the Method of Harmonic Balance—A Review of the Art. Part I. Introductory Concepts," Int. J. on Microwave and Millimeter Wave Computer Aided Engineering, Vol. 1, No. 1, 1991; and V. Rizzoli, C. Cecchetti, A. Lipparini and F. Fastri, "General-Purpose Harmonic Balance Analysis of Nonlinear Microwave Circuits Under Multitone Excitation," IEEE Trans. Microwave Theory and Tech., Vol. MTT-36, pp. 1650–1660, December 1988, all of which are incorporated by reference herein.

As noted above, n is used to denote the number of node waveforms which must be stored to capture the behavior of the circuit being analyzed. Even a medium-sized integrated circuit (IC) can have hundreds of nodes, especially if a sophisticated transistor model is used. The transform dimension N can also become large in the case of a multi-tone analysis. For the simulation of a mixer, for example, a designer might request 16 harmonics of the mixer local oscillator and 8 harmonics of the input signal frequency. Because two real numbers are needed to capture the amplitude and phase of each spectral component, the final transform dimension is on the order of $N=2\times8\times16=256$. The overall dimension of the system of harmonic balance equations is nN, which can become quite large in practical applications. Letting X denote the aggregate vector of all unknown Fourier coefficients, the harmonic balance equations may be written as a harmonic balance system $H(X)=0$ of size nN.

The preferred conventional methods for solving harmonic balance equations are Newton-based techniques due to their fast convergence and high accuracy. Such techniques are described in, for example, J. M. Ortega and W. C. Rheinboldt, "Iterative Solutions of Non-linear Equations in Several Variables," Academic Press, New York, 1969, which is incorporated by reference herein. However, most implementations of Newton-based techniques require the use of a Jacobian matrix $\partial H/\partial X$ which is of dimension nN and is generally much more dense than conventional matrices which arise in numerical circuit simulation. As a result, inversion of the harmonic balance Jacobian matrix becomes a computational bottleneck and is largely responsible for the limitation of conventional harmonic balance techniques to analysis of relatively small circuits. Other techniques have been proposed which attempt to simplify or avoid the inversion of the Jacobian matrix. For example, V. Rizzoli, F. Mastri, F. Sgallari and V. Frontini, "The Exploitation of Sparse Matrix Techniques in Conjunction with the Piece-Wise Harmonic Balance Method for Nonlinear Microwave Circuit Analysis," IEEE MTT-S Int. Microwave Symp. Digest, Dallas, pp. 1295–1298, May 1990, which is incorporated by reference herein, attempts to solve the harmonic balance equations using approximate inversions of the Jacobian matrix. A technique described in S. A. Maas, "Nonlinear Microwave Circuits," Artech House, 1988, which is incorporated by reference herein, attempts to solve the harmonic balance equations without using the Jacobian matrix at all.

However, there are a number of advantages associated with exact inversion of the full harmonic balance Jacobian matrix. First, Newton's method with accurate Jacobian matrix inversion exhibits local quadratic convergence, that is, a solution to the harmonic balance system can be obtained to machine precision in a fixed, small number of iterations. Thus, the overall solution time would be small if the accurate Jacobian inversion could be done efficiently. Second, widely convergent continuation methods for solving the harmonic balance equations generally also require solving linear systems involving the Jacobian matrix as a sub-matrix. These widely convergent continuation methods are described in greater detail in, for example, L. Watson, "Globally Convergent Homotopy Methods: A Tutorial," Appl. Math. and Comp., Vol. 31BK, pp. 369–396, 1989, which is incorporated by reference herein. Finally, the inverted Jacobian matrix can be interpreted as a linearization of a circuit in a small-signal sense, and can therefore be utilized for sensitivity computation and noise analysis, as described in S. W. Director and R. A. Rohrer, "Automated Network Design—the Frequency Domain Case," IEEE Trans. Circuit Theory, Vol. CT-16, pp. 330–337, 1969, and R. A. Rohrer, L. Nagel, R. Meyer and L. Weber, "Computationally-Efficient Electronic Circuit Noise Calculations," IEEE J. Solid State Circuits, Vol. SC-6, pp. 204–213, 1971, respectively, both of which are incorporated by reference herein. Additional support for the need for accurate Jacobian inversion may be found in V. Rizzoli, F. Mastri and D. Masotti, "A Hierarchical Harmonic Balance Technique for the Efficient Simulation of Large Size Microwave Circuits," $25^{th}$ European Microwave Conference, Bologna, Italy, September 1995, pp. 615–619, which is incorporated by reference herein. Fast and accurate inversion of the Jacobian matrix is therefore a key enabling technology for further progress in the analysis of large nonlinear circuits as well as in other important applications of the harmonic balance technique.

It is apparent from the above that a need exists for improved techniques for inverting or otherwise processing a harmonic balance matrix generated as part of a frequency domain analysis of a large nonlinear circuit or other device, such that the storage and computation requirements associated with processing the matrix are considerably reduced.

SUMMARY OF THE INVENTION

The present invention provides methods and apparatus for performing frequency domain analysis using compressed matrices to reduce the computation and storage requirements associated with solving a harmonic balance system. A nonlinear circuit, system or other device to be analyzed includes n unknown node spectra, each characterized by N spectral coefficients in the system of harmonic balance equations. A compressed version of a Jacobian matrix J representing the system of harmonic balance equations is generated by forming m sequences of length N using block diagonal matrices associated with the Jacobian matrix J, converting each of the m sequences to the frequency domain using a discrete Fourier transform, such that a set of Fourier coefficients are generated for each of the m sequences, and storing only those Fourier coefficients which exceed a threshold as the compressed version of the Jacobian matrix J. Information generated from an inverse transform of the compressed version is utilized to solve a preconditioned linear system $\tilde{J}^{-1}JZ=\tilde{J}^{-1}W$ which is based on an approximation $\tilde{J}$ of the Jacobian matrix J.

In an exemplary embodiment of the invention, a processor reads in a circuit description having n unknown node spectra in a steady-state mode of operation, and generates a system H(X) of harmonic balance equations allocating N spectral coefficients to each of the n unknown node spectra. A residual of H(X) is evaluated using an initial approximation of the nN unknowns X. If the magnitude of the residual is determined to be less than a user-selected constant, the initial approximation of X is printed or otherwise displayed as the solution to H(X). If the magnitude of the residual is determined to be greater than or equal to the constant, the harmonic balance Jacobian matrix J is formed and a compressed version of J is stored. The compressed version may be generated by forming m sequences in each of two block-diagonal matrices C and G which are components of the Jacobian matrix J, with each of the sequences having length N, converting each of the m sequences to the frequency domain using a DFT process, discarding any Fourier coefficients which fall below a user-selected threshold, and storing only the remaining Fourier coefficients. In practice, m is a small multiple of the number n of unknown node spectra, typically less than or equal to about 8n. This compressed matrix storage of the present invention provides a substantial reduction in the storage and computation requirements associated with processing the harmonic balance Jacobian matrix J. The linear system JZ=W is then solved using Newton's method or another suitable technique. As part of this process, a preconditioner matrix $\tilde{J}$ is formed as an approximation of the Jacobian matrix J, and an iterative linear equation algorithm, such as QMR or GMRES, is invoked to solve the preconditioned system of equations $\tilde{J}^{-1}JZ=\tilde{J}^{-1}W$. Each step k of the iterative linear algorithm may involve computing a matrix-vector product $Jz_k$ given by $(\Gamma G\Gamma^{-1}+\Omega\Gamma C\Gamma^{-1})z_k$ where $z_k$ is a sub-vector of matrix Z. Individual multiplications with $\Gamma$, $\Gamma^{-1}$, $\Omega$ and the diagonal matrices C and G are generally very fast. In accordance with the invention, the multiplication of a vector by the block-diagonal matrix C or G may be performed in a piece-wise manner, such that for each of the n length-N sub-vectors $z_k$, the sequence of length N is reconstructed by performing an inverse transform of the compressed version of the Jacobian matrix J. The multiplication result is accumulated in an output buffer as each of the m above-noted sequences is reconstructed. The iterative linear algorithm is terminated when the solution to the preconditioned system $\tilde{J}^{-1}JZ=\tilde{J}^{-1}W$ has been obtained to sufficient accuracy. An updated approximation to the set of unknowns X is then computed, and the process repeats starting with evaluation of the residual of H(X) using the new approximation of X. In this manner, a solution to the system H(X) of harmonic balance equations is generated in a more efficient manner than has heretofore been possible.

When the Jacobian matrix J is compressed in the manner described above, the dominant memory cost in the nonlinear circuit analysis becomes the storage required for the iterative linear equation algorithm. The present invention also provides techniques for reducing the amount of storage and computation time required by the linear equation algorithm. For example, the linear equation algorithm may be configured to utilize Householder vectors which can be made sparse in many harmonic balance applications. If a is the largest magnitude of any of the entries in one of the vectors, then zeroing vector entries with a magnitude less than about $10^6$ times a will eliminate about 90% of the entries for large harmonic balance problems, without compromising the accuracy of the linear solve. Furthermore, the nonzeros in a given vector $w_i$ generally correspond to nonzeros in vector $w_{i+1}$, with $w_{i+1}$ also having some additional nonzeros. The information about the positions of nonzeros can thus be shared among all vectors, thereby improving computation time in the linear equation algorithm.

The frequency domain analysis techniques of the present invention may be implemented in a software program running on a personal computer, workstation, microcomputer, mainframe computer or any other type of programmable digital processor. The invention substantially reduces the storage and computation requirements associated with processing a system of harmonic balance equations for characterizing nonlinear analog circuits and other devices during frequency domain analysis. These and other features and advantages of the present invention will become more apparent from the accompanying drawings and the following detailed description.

DETAILED DESCRIPTION OF THE INVENTION

The present invention will be illustrated below in conjunction with exemplary frequency domain analysis techniques particularly well-suited for use in analyzing a large nonlinear analog circuit. It should be understood, however, that the invention is not limited to use with any particular type of frequency domain analysis or device. The disclosed techniques are suitable for use with a wide variety of other frequency domain analysis techniques and in numerous alternative applications. The term "system of harmonic balance equations" as used herein refers generally to a set of frequency domain equations, or a representation of such a set of equations, which forms the basis of computations performed to characterize the frequency domain performance of a circuit, system or other device.

Figure 1:
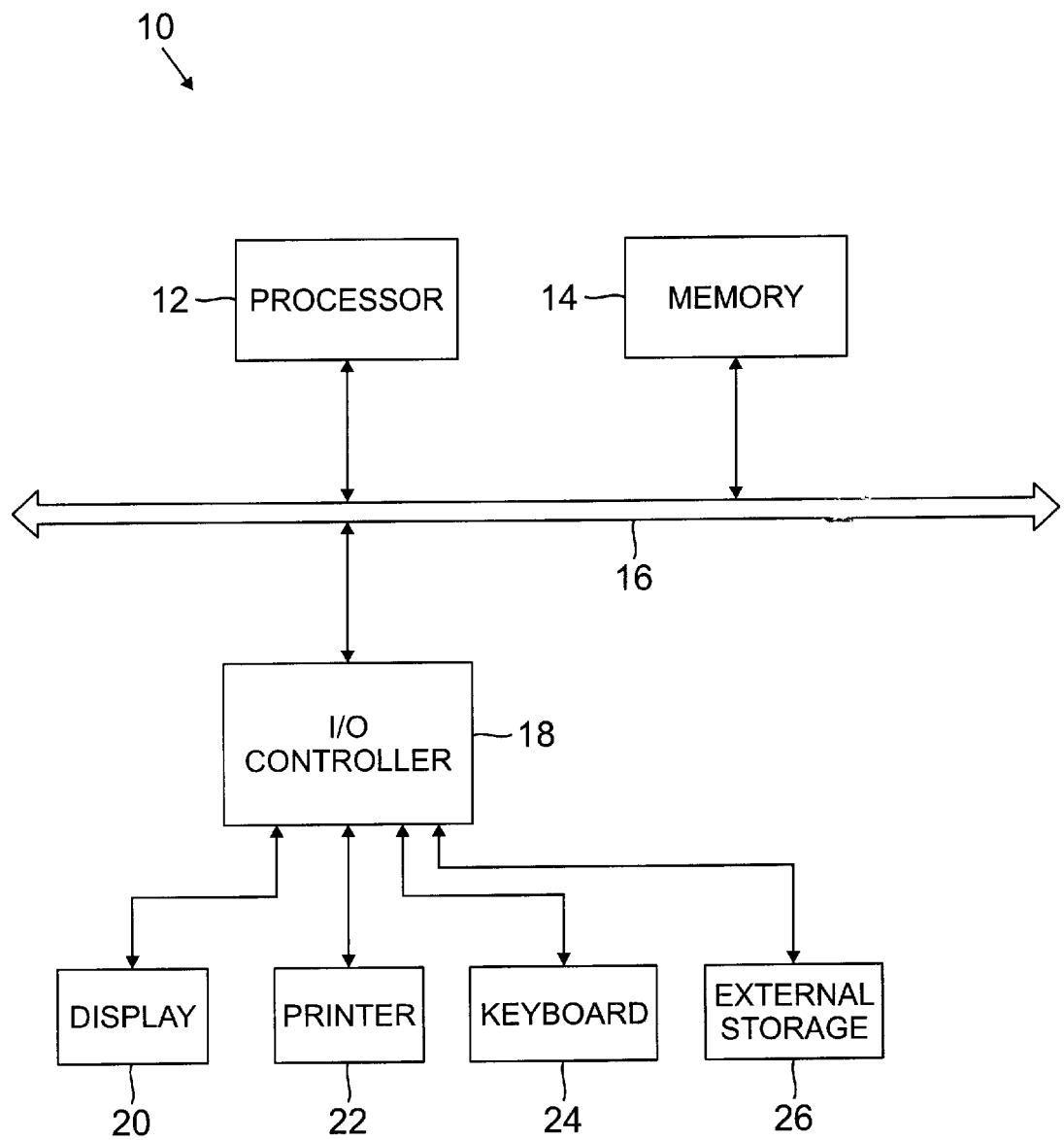
FIG. 1 is a block diagram of a processing system in which frequency domain analysis of nonlinear circuits may be implemented in accordance with the invention.

FIG. 1 shows an exemplary processing system 10 in which nonlinear circuit analysis techniques in accordance with the present invention may be implemented. The processing system 10 includes a processor 12 and a memory 14 which are connected to communicate via a bus 16. The system 10 further includes an input/output (I/O) controller 18 which is connected to the bus 16 in order to communicate with the processor 12 and memory 14. The I/O controller 18 in conjunction with the processor 12 directs the operation of a number of peripheral components including a display 20, a printer 22, a keyboard 24 and an external storage device 26. The elements 12, 14, 16 and 18 of system 10 may represent portions of a desktop or portable personal computer, a microcomputer, a workstation, a mainframe computer or other type of digital processor. The memory 14 and external storage device 26 may be electronic, magnetic or optical storage devices. The present invention may be implemented in the form of a computer software program stored in memory 14. The program is executed by processor 12 in accordance with user-supplied input circuit data to produce a desired output analysis in a predetermined format on display 20 or on a print-out generated by printer 22. The user-supplied input data may be entered at the keyboard 24 or read from one or more files of external storage device 26.

An exemplary embodiment of the present invention to be described below will utilize a general form of nonlinear circuit equations in accordance with the well-known MNA formulation. This formulation is given as follows:

$$\int_{-\infty}^{t} y(t-\tau)x(\tau)d\tau + \frac{d}{dt} q(x(t)) + f(x(t)) - b(t) = 0. \quad (1)$$

The MNA formulation specifies a system of n equations where x(t) is an n-vector of circuit variables, such as currents, voltages, charges and fluxes. The first term of the formulation represents the contribution of distributed elements expressed using Green functions. The d/dt q(x(t)) term represents the contribution of reactive circuit components, such as capacitors and inductors. The $f(x(t))$ term represents the contribution of non-reactive circuit components, such as resistors. Finally, b(t) is an excitation term representing independent sources, which, in the exemplary embodiment described below, are sinusoidal signals or tones of one or more incommensurate frequencies. The b(t) term may therefore be expressed as:

$$b(t) = \sum_{i=1}^{p} b_k e^{j\omega_i t}. \quad (2)$$

The response of most practical circuits has a discrete spectrum with components at integer combinations of the excitation frequencies:

$$x(t) = \sum_{k_1, \ldots k_p \in Z} x_{k_1, \ldots k_p} e^{j(k_1\omega_1 + \ldots + k_p\omega_p)t}. \quad (3)$$

Circuits that oscillate will also generate components at other frequencies. The illustrative embodiment of the invention to be described below assumes that response spectra are located at combinations of the excitation frequencies, but can be readily extended to handle oscillations. Due to the attenuation of the high frequencies in practical circuits, it will also be assumed that only a finite subset of the frequency components is significant. The finite subset may be given by:

$$\{\omega_0, \ldots \omega_{N-1}\} \subset \{k_1\omega_1 + \ldots k_p\omega_p\}_{k_1, \ldots k_p} \in Z. \quad (4)$$

Figure 2A:
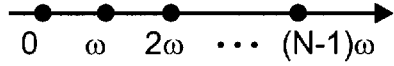
FIGS. 2A and 2B illustrate frequency points to be analyzed in one-tone and two-tone frequency domain analyses, respectively, in accordance with the invention.
Figure 2B:
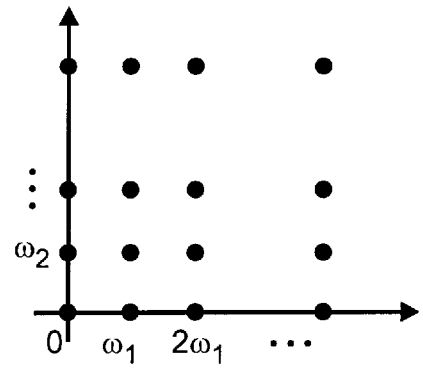

FIG. 2A illustrates the subset of significant frequencies in the case of one-tone analysis. In the one-tone case, the subset includes a DC component, the fundamental frequency ω and a number of harmonics iω, i=2, 3, . . . N−1. FIG. 2B illustrates the subset of significant frequencies in the case of a two-tone analysis. In the two-tone case, the subset includes the DC component, the two fundamental frequencies $\omega_1$ and $\omega_2$, and a number of harmonics and intermodulation products of the two fundamental frequencies. Subsets for three or more excitation tones may be formed in a similar manner. The resulting circuit response is defined by the N coefficients corresponding to each of the n circuit variables, and may be given by:

$$x(t) = \sum_{k=0}^{N-1} X_k e^{j\omega_k t}. \quad (5)$$

A Fourier transform is applied to the above circuit equation (1), and the time-domain convolution is mapped into a frequency-domain product, to obtain:

$$Y(\omega)X(\omega) + j\omega Q(\omega) + F(\omega) - B(\omega) = 0 \quad (6)$$

where Y(ω), X(ω), F(ω), Q(ω) and B(ω) are Fourier transforms of the time domain functions y(t), x(t), $f(x(t))$, q(x(t)) and b(t), respectively. The nN equations necessary to determine nN coefficients are obtained by forcing the system of n functional equations to hold at the N frequency points of interest. This may be expressed as:

$$Y(\omega_0)X_0 + j\omega_0 Q(\omega_0) + F(\omega_0) - B(\omega_0) = 0 \quad (7)$$

$$Y(\omega_1)X_1 + j\omega_1 Q(\omega_1) + F(\omega_1) - B(\omega_1) = 0$$

$$\vdots$$

$$Y(\omega_N)X_N + j\omega_N Q(\omega_N) + F(\omega_N) - B(\omega_N) = 0.$$

For notational simplicity, it will be assumed that the above general formulation includes a single equation. The nonlinear functions F and Q depend on the frequency coefficients $[X_0, \ldots, X_{N-1}]^T$. The dependence for the nonlinear function F will now be illustrated. The frequency coefficients $[X_0, \ldots, X_{N-1}]^T$ are first transformed to the time domain, and a sample of circuit variables $[x(t_1), x(t_{N-1})]^T$ is obtained at different time points. The function $f$ is evaluated for each of the time points to yield $[f(x(t_1)), \ldots, f(X(t_{N-1}))]^T$ which is transformed back to the frequency domain. This process in matrix notation is given by:

$$\begin{bmatrix} F(\omega_0) \\ \vdots \\ F(\omega_{N-1}) \end{bmatrix} = \Gamma \begin{bmatrix} f(\cdot) & & \\ & \ddots & \\ & & f(\cdot) \end{bmatrix} \Gamma^{-1} \begin{bmatrix} X_0 \\ \vdots \\ X_{N-1} \end{bmatrix} \quad (8)$$

where $\Gamma$ represents the time-to-frequency-domain transform and the diagonal matrix denotes the application of a non-linear operator. In the case of one-tone analysis, both the frequency domain and time-domain samples are equally spaced, and time-to-frequency and frequency-to-time transforms represent a discrete Fourier transform (DFT) and inverse DFT (IDFT), respectively, which may be computed using the efficient fast Fourier transform (FFT). The use of the FFT can be extended to the case of multi-tone analysis, as discussed in the reference K. S. Kundert, J. K. White and A. Sangiovanni-Vincentelli, "Steady-State Methods for Simulating Analog and Microwave Circuits," Kluwer, Boston, Mass., 1990.

The discretized system of circuit equations (7) given above then becomes:

$$\begin{bmatrix} Y(\omega_0) & & \\ & \ddots & \\ & & Y(\omega_{N-1}) \end{bmatrix} \begin{bmatrix} X_0 \\ \vdots \\ X_{N-1} \end{bmatrix} + \begin{bmatrix} j\omega_0 & & \\ & \ddots & \\ & & j\omega_{N-1} \end{bmatrix} \Gamma \begin{bmatrix} q(\cdot) & & \\ & \ddots & \\ & & q(\cdot) \end{bmatrix} \Gamma^{-1} \begin{bmatrix} X_0 \\ \vdots \\ X_{N-1} \end{bmatrix} + \Gamma \begin{bmatrix} f(\cdot) & & \\ & \ddots & \\ & & f(\cdot) \end{bmatrix} \Gamma^{-1} \begin{bmatrix} X_0 \\ \vdots \\ X_{N-1} \end{bmatrix} - \begin{bmatrix} B(\omega_0) \\ \vdots \\ B(\omega_{N-1}) \end{bmatrix} = 0 \quad (9)$$

or more compactly:

$$YX + \Omega \Gamma q(\cdot) \Gamma^{-1} X + \Gamma f(\cdot) \Gamma^{-1} X - B = 0. \quad (10)$$

The diagonal matrix $\Omega$ represents the frequency-domain differentiation operator. The above system of equations is a harmonic balance system of equations $H(X)=0$. For a system of n circuit equations, additional permutation operators may be inserted to ensure that the various operators have the required vector order. Using a technique such as the well-known Newton's method to solve the harmonic balance system of equations $H(X)=0$ generally requires a linear solve process with a Jacobian matrix $J=\partial H/\partial X$ computed at each iteration. The Jacobian matrix of the system of equations (9) is:

$$J = Y + \Omega \Gamma C \Gamma^{-1} + \Gamma G \Gamma^{-1} \quad (11)$$

where C and G are generally block-diagonal matrices, with the diagonal elements representing circuit linearizations at the sampled time points. The C and G matrices may therefore be written as:

$$C = \begin{bmatrix} \frac{\partial q}{\partial x}\bigg|_{t_1} & & \\ & \ddots & \\ & & \frac{\partial q}{\partial x}\bigg|_{t_N} \end{bmatrix}, G = \begin{bmatrix} \frac{\partial f}{\partial x}\bigg|_{t_1} & & \\ & \ddots & \\ & & \frac{\partial f}{\partial x}\bigg|_{t_N} \end{bmatrix} \quad (12)$$

Each diagonal block of the C and G matrices has dimension n×n and includes m nonzero entries. In practice, m is a small multiple of n, typically less than or equal to about 8n. The position of each of the m nonzero entries in a given C or G matrix is replicated in each of the N diagonal blocks of that C or G matrix.

Figure 3:
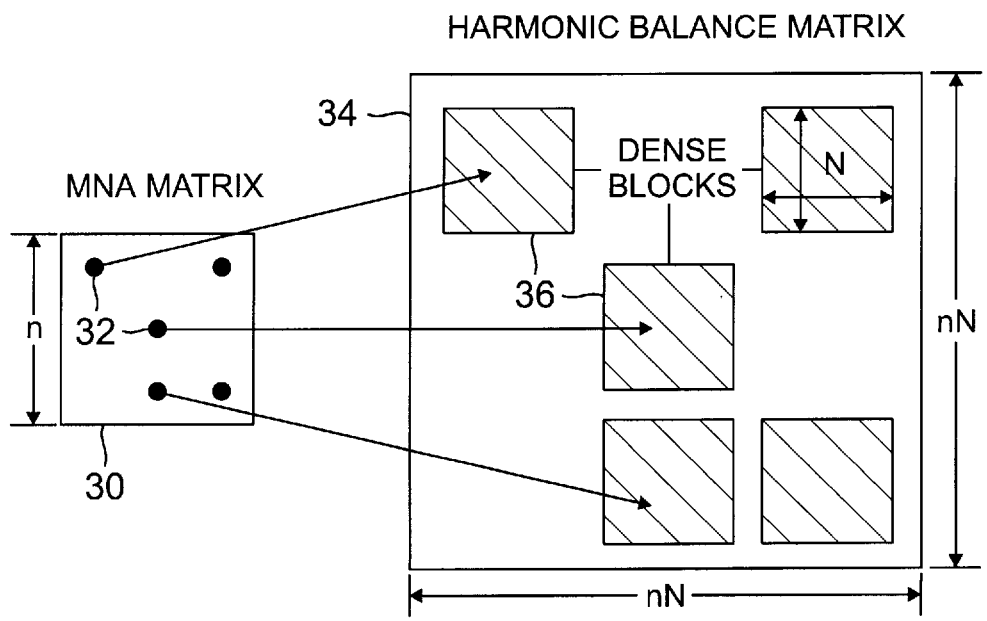
FIG. 3 illustrates the relationship between a conventional MNA matrix and a corresponding harmonic balance Jacobian matrix, showing the dense block structure in the harmonic balance Jacobian matrix which is used to simplify frequency domain analysis in accordance with the invention.

FIG. 3 illustrates an n×n MNA matrix 30 including a number of distinct portions 32, and a corresponding harmonic balance Jacobian matrix 34. The Jacobian matrix 34 is a large and dense matrix of dimension nN×nN, and includes a number of dense N×N blocks 36 each corresponding to one of the portions 32 of the MNA matrix 30. Direct factorization or even storage of the Jacobian matrix 34 would be likely to require unduly excessive computer resources even for analysis of a medium-sized circuit.

The present invention applies iterative techniques to the solution of the above-described linear system. One such technique is a Krylov subspace method known as QMR and described in greater detail in R. Freund, G. H. Golub and N. M. Nachtigal, "Iterative Solution of Linear Systems," Acta Numerica, pp. 57–100, 1991, which is incorporated by reference herein. These and other iterative techniques are particularly well-suited for solving the harmonic balance system of equations since these techniques derive all matrix information solely from products of the matrix with vectors. It can be seen from the expression:

$$JZ = YZ + \Omega \Gamma C \Gamma^{-1} Z + \Gamma G \Gamma^{-1} Z \quad (13)$$

that such matrix-vector products can be computed very efficiently, without the use of the full matrix J, using multiplications with sparse matrices and FFTs. Unfortunately, many iterative linear solvers, and the above-noted Krylov subspace methods in particular, generally do not converge reliably. The present invention therefore utilizes preconditioning to ensure reliable convergence. For example, the linear system of equations $JZ=W$ may be replaced with a preconditioned system $\tilde{J}^{-1}JZ = \tilde{J}^{-1}W$ which has the same solution as the original system. To ensure robust and efficient convergence, the preconditioner matrix $\tilde{J}$ should be a good approximation of J, and also should be relatively easy to invert. An exemplary preconditioning method particularly well-suited to the structure of the harmonic balance Jacobian matrix will be described in greater detail below.

The terms that introduce the dense blocks 36 in the harmonic balance Jacobian matrix 34 of FIG. 3 are typically the $\Gamma C \Gamma^{-1}$ term and the $\Gamma G \Gamma^{-1}$ term of equation (13) above. These terms generally result in circulant or block-circulant matrices. For example, the $\Gamma C \Gamma^{-1}$ term produces a circulant matrix as follows:

$$\Gamma \begin{bmatrix} c_1 \\ & \cdot \\ & & \cdot \\ & & & \cdot \\ & & & & c_N \end{bmatrix} \Gamma^{-1} = \begin{bmatrix} C_1 & C_2 & \cdots & C_N \\ C_N & C_1 & & \cdot & \cdot \\ \cdot & & & & \cdot \\ \cdot & & & & C_2 \\ \cdot & & & & \\ C_2 & \cdots & & C_N & C_1 \end{bmatrix} = \text{circulant }(C_1, \ldots, C_N) \quad (14)$$

where $[C_1, \ldots, C_N]^T$ is the DFT of $[c_1, \ldots, c_N]^T$. If the circuit being analyzed is linear, the elements $c_1, \ldots, c_N$ on the diagonal of the matrix C are all identical, since the linearization of a linear circuit does not vary. In this case only $C_1$ is nonzero and equal to the diagonal elements. The analysis of the $\Gamma G \Gamma^{-1}$ term is similar. The Jacobian matrix for a linear circuit therefore becomes a diagonal or block diagonal matrix $J_{lin}$ as shown below:

$$J_{lin} = \begin{bmatrix} Y(\omega_0) + G + j\omega_0 C & & \\ & \cdot & \\ & & \cdot \\ & & & Y(\omega_{N-1}) + G + j\omega_{N-1}C \end{bmatrix} \quad (15)$$

and is therefore relatively easy to invert.

Figure 4:
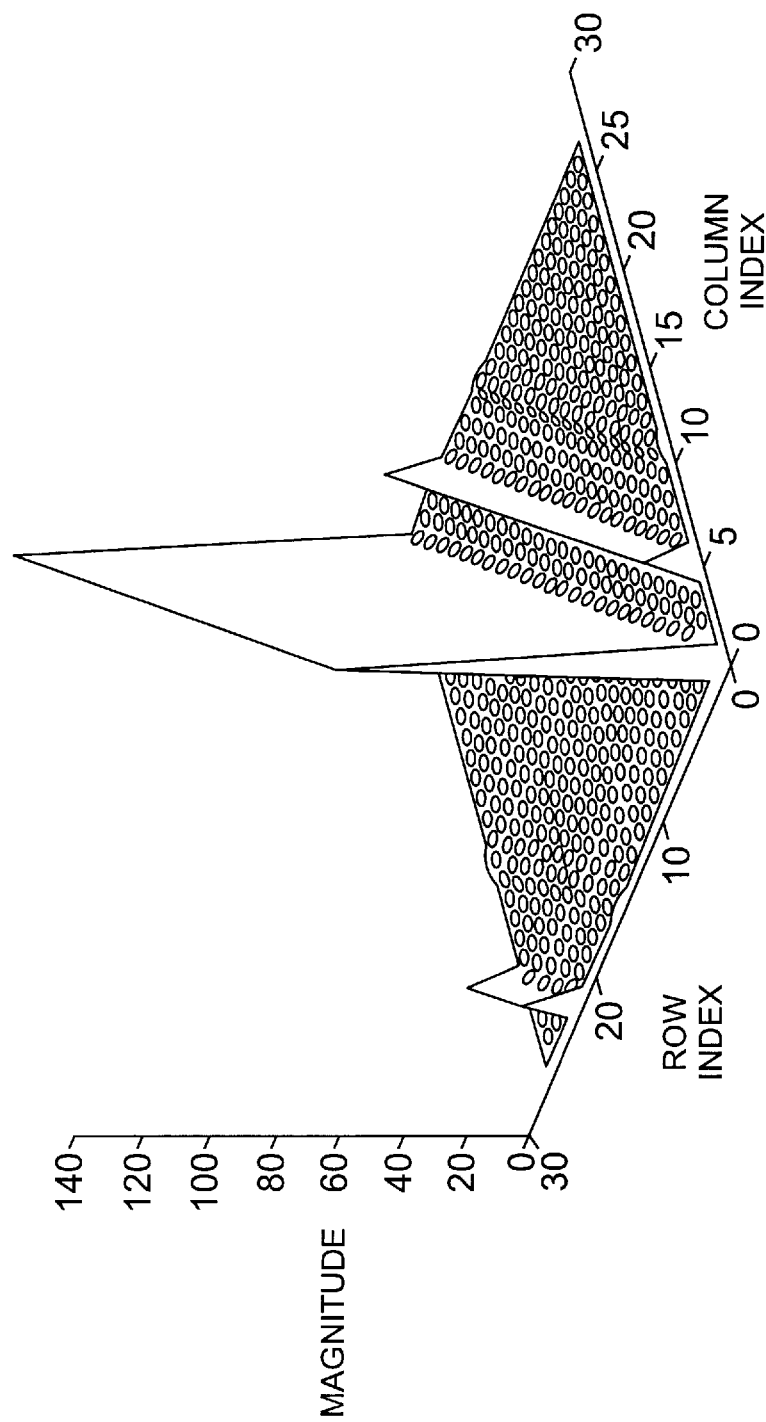
FIG. 4 is a graph illustrating the magnitudes of circulant matrix entries characterizing the dense blocks of the harmonic balance Jacobian matrix of FIG. 3.

The circulant matrix fills up when the circuit being analyzed is nonlinear. However, as illustrated in FIG. 4, the entries with the greatest magnitudes are typically concentrated on the diagonal of the circulant matrix. The elements $C_2, \ldots, C_{N-1}$ and $G_2, \ldots, G_{N-1}$ can therefore be set to zero and the resulting diagonal matrix used as a preconditioner. In such a case, the diagonal elements $C_1$ and $G_1$ represent the average of the circuit linearizations at all time points. If the circuit is only mildly nonlinear, the resulting diagonal matrix is a good approximation of the harmonic balance Jacobian matrix and serves as an effective preconditioner. When stronger nonlinearities exist in the circuit, certain off-diagonal elements of the circulant matrix may also be included in the preconditioner. In this case, the Jacobian matrix approximation is no longer diagonal but remains much sparser than the original Jacobian matrix and therefore within the capabilities of well-known direct factorization algorithms.

The compressed matrix storage aspects of the present invention will now be described in greater detail. The Jacobian matrix J in equation (11) above is computed at a particular point designated by a nonlinear solver, such as Newton's method. The Jacobian matrix J generally must be stored for use in subsequent matrix-vector multiplications. Using conventional storage techniques, the block-diagonal matrices C and G for a typical circuit may require on the order of mN floating point numbers, where, as noted above, m is generally less than or equal to about 8n. For values of n and N on the order of a thousand, the storage of C and G could easily consume hundreds of megabytes. The compressed storage techniques of the present invention address and solve this problem. Consider an exemplary nonzero $g_k$ in a particular position in the kth n×n block along the diagonal of the G matrix. The set of nonzeros $\{g_k\}$, k=1, 2, ... N, includes a nonzero in the same position in each one of the N diagonal blocks of G, and forms a time series of length N. For linear circuit elements, this will be a constant sequence. More generally, the sequence has spectral properties similar to that of the waveforms in the circuit being analyzed. The present invention provides compressed storage by converting each time series to its frequency domain representation. During a subsequent matrix-vector multiplication using equation (11), the nonzeros in the C and G matrices may be reconstructed from compressed storage one at a time, using inverse transform operations, while the final result of the multiply is accumulated in an output buffer. Spectral coefficients for derivative entries which fall below a threshold are discarded. The threshold may be expressed in terms of decibels (dB) relative to the most significant coefficient. A threshold of about −80 dB gives about a factor of ten compression without significantly compromising the accuracy of the matrix-vector multiplication. It should be noted that more aggressive compression may corrupt the quality of the linear solves to the extent the outer Newton iteration is no longer quadratically convergent.

When the Jacobian matrix is compressed in the manner described above, the dominant memory cost in the nonlinear circuit analysis becomes the storage required for the iterative linear solver. In an illustrative embodiment of the present invention, the linear solver may be a variant of the GMRES technique based on Householder orthogonalization, such that the required vectors are the Householder vectors, as described in Y. Saad and M. Schultz, "GMRES: A Generalized Minimal Residual Method for Solving Nonsymmetric Linear Systems," SIAM J. Sci. Stat. Comput., Vol. 7, pp. 856–869, 1986, which is incorporated by reference herein. These Householder vectors can be made sparse in many harmonic balance applications. If a is the largest magnitude of any of the entries in one of the vectors, then zeroing entries with a magnitude less than about $10^{-6}$ times a will eliminate about 90% of the entries for large harmonic balance problems, without compromising the accuracy of the linear solve. Furthermore, the nonzeros in vector $w_i$ generally correspond to nonzeros in vector $w_{i+l}$, with $w_{i+l}$ also having some additional nonzeros. Thus, the information about the positions of nonzeros can be shared among all vectors. Finally, the elements of the Householder vectors can generally be stored in single precision without affecting the linear solve. The present invention provides compression factors between about ten and one hundred in the linear solve memory required for large nonlinear circuit analysis problems.

Figure 5:
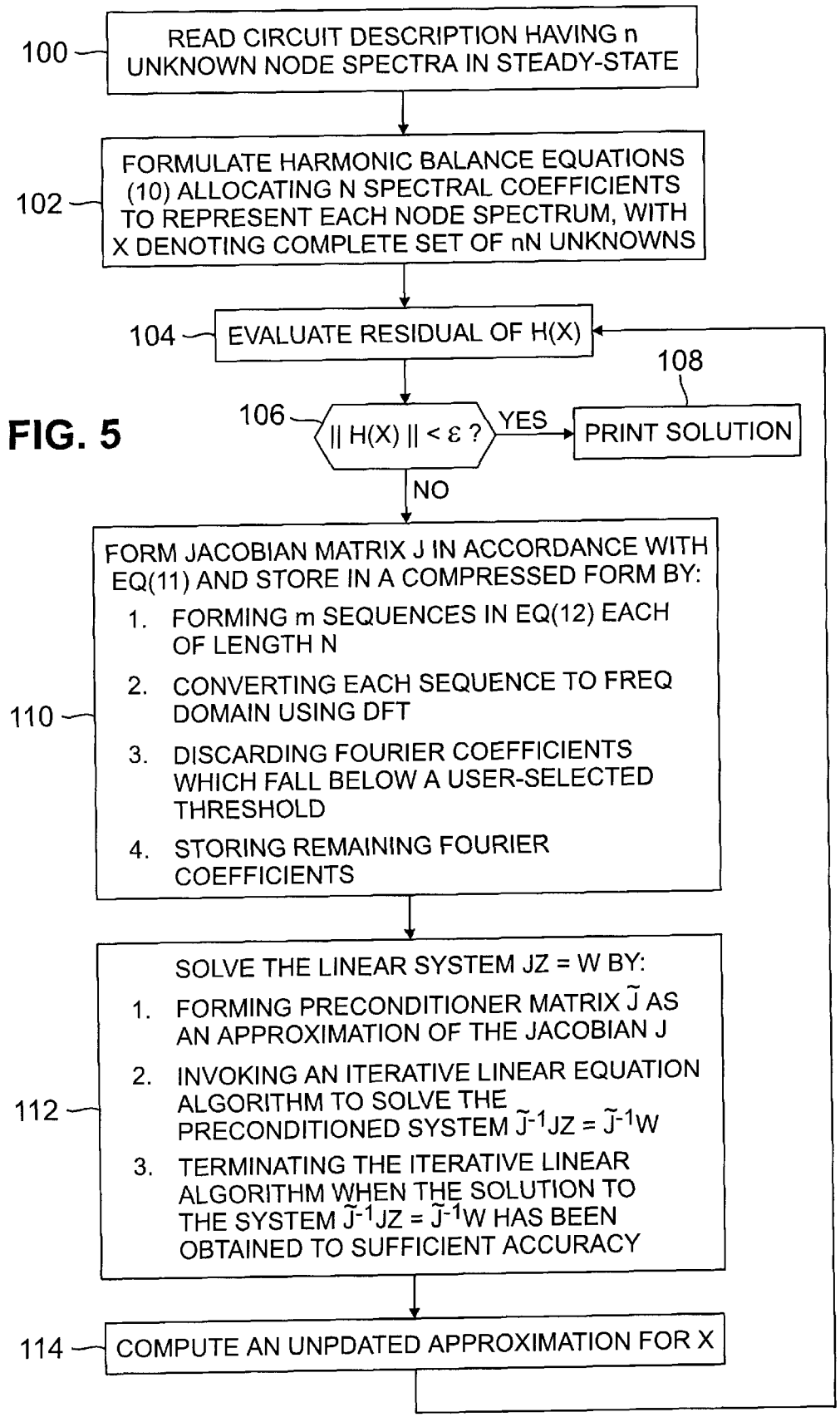
FIG. 5 is a flow diagram illustrating a nonlinear circuit analysis process with compressed storage of a harmonic balance Jacobian matrix in accordance with the present invention.

FIG. 5 is a flow diagram illustrating an exemplary nonlinear circuit analysis process in accordance with the present invention. The processing steps shown may be implemented in a computer program executed by processor 12 in the system of FIG. 1. In step 100, the processor 12 reads a description of a nonlinear circuit to be analyzed. The description may be read from one or more existing files in memory 14 or external storage device 26, or from manual data entries of a user at keyboard 24. The circuit description in this example includes n unknown circuit node spectra in steady-state operation. A system of harmonic balance equations in accordance with equation (10) is then formulated, as shown in step 102. The harmonic balance equations allocate N spectral coefficients to each of the n node spectra of step 100, with X denoting the resulting complete set of nN unknowns. As previously noted, the system of harmonic balance equations is also designated H(X). In step 104, a residual of H(X) is evaluated using an initial approximation of X. If the magnitude of the residual is determined in step 106 to be less than a user-selected constant $\epsilon$, the initial approximation of X is printed or otherwise displayed as the solution in step 108. Suitable values for the user-selected constant $\epsilon$ may be on the order of $10^{-8}$.

If the magnitude of the residual is determined in step 106 to be greater than or equal to the constant $\epsilon$, the above-described harmonic balance Jacobian matrix J of equation (11) is formed, as indicated in step 110. Step 110 further indicates that the Jacobian matrix J is stored in a compressed format. The compressed format is generated by forming m sequences in each of the C and G matrices of equation (12), with each of the sequences having length N, converting each of the m sequences to the frequency domain using a DFT process, discarding any Fourier coefficients which fall below a user-selected threshold, and storing only the remaining Fourier coefficients. As noted above, this compressed storage format of the present invention provides a substantial reduction in the memory capacity required to process the harmonic balance Jacobian matrix. In step 112, the linear system $JZ=W$ is solved using a Newton-based method. The above-noted preconditioner matrix $\tilde{J}$ is formed as an approximation of the Jacobian matrix J, and an iterative linear equation algorithm, such as QMR or GMRES, is invoked to solve the preconditioned system of equations $\tilde{J}^{-1}JZ=\tilde{J}^{-1}W$. Each step k of the iterative linear algorithm may involve computing a matrix-vector product $Jz_k$ given by $(\Gamma G\Gamma^{-1}+\Omega\Gamma C\Gamma^{-1})z_k$, where $z_k$ is a sub-vector of matrix Z. Equation (11) above may be used to accomplish this multiplication in an efficient manner. More particularly, the multiplication of a vector by the matrix C or G may be performed in a piece-wise manner, such that for each of the n length-N sub-vectors $z_k$, the sequence of length N is reconstructed by performing an inverse transform of the compressed data stored in step 110. The iterative linear algorithm is terminated when the solution to the preconditioned system $\tilde{J}^{-1}JZ=\tilde{J}^{-1}W$ has been obtained to sufficient accuracy. An updated approximation to the set of unknowns X is then computed in step 114, and the process returns to step 104 to evaluate the residual of H(X) using the new approximation of X. The new approximation of X may be generated as the sum of the previous X and the corresponding z values generated in step 112, in accordance with Newton's method. Alternatively, the new X may be the sum of the previous X and the corresponding z values multiplied by a constant $\theta$, where $0<\theta\leq 1$, in accordance with the Damped Newton's method. Newton's method and the Damped Newton's method are both described in greater detail in the reference J. M. Ortega and W. C. Rheinboldt, "Iterative Solutions of Non-linear Equations in Several Variables," Academic Press, New York, 1969.

A number of exemplary simulations have been performed on a front-end of a 900 MHz integrated direct conversion receiver using nonlinear circuit analysis techniques of the present invention. The analyzed front-end circuitry included a low noise amplifier (LNA) driving I and Q mixers, with 27 bipolar transistors and a variety of linear devices. The steady-state solution is described by about 300 waveforms, many of which are for internal nodes of a detailed transistor model used to characterize the behavior or the circuit. One-tone simulations of the LNA alone were used to measure gain and 1 dB compression point. Local oscillator (LO) feedthrough from the mixers back into the LNA was also measured with one-tone simulations. For the latter simulations, the LO amplitude was raised in steps in order to keep the Newton loop under control. Once the LO was being driven with the desired amplitude, the solution was captured and used as a starting point for subsequent runs. This arrangement permits quick resimulation after a component value change, thus allowing a user to explore different design alternatives in an efficient manner. Information from the LO feedthrough simulations was used in designing single-ended to differential conversion circuitry for use in the front-end between the LNA and the mixers. Two-tone simulations were used to measure intermodulation in the LNA alone, and conversion gain in the full front-end circuit.

As in the LO feedthrough simulation, the conversion gain tests involved capturing the solution from an initial run and using it to speed subsequent tests for a number of slightly different circuits. The simulations are summarized in more detail in TABLE I below. The transform column of TABLE I indicates whether the transform is a one-tone (1T), two-tone (2T) or three-tone (3T) transform, and the number N of Fourier coefficients to be solved for.

TABLE I

| Circuit | n | Transform | Un-knowns | Purpose | Time |
|---|---|---|---|---|---|
| LNA | 223 | 1T, N = 3 | 669 | LNA gain | 10 s |
| LNA | 223 | 1T, N = 35 | 7,805 | Compression point | 1 m 30 s |
| LNA | 223 | 2T, N = 175 | 39,025 | Intermodulation | 1 m 30 s |
| LNA + mixer | 317 | 1T, N = 63 | 19,971 | LO feedthrough | 15 m/2 m 30 s |
| LNA + mixer | 317 | 2T, N = 175 | 55,475 | Conversion gain | 20 m/5 m |
| LNA + mixer | 317 | 3T, N = 2,025 | 641,925 | Desensitization | 3 h |
| LNA + mixer | 317 | 3T, N = 2,625 | 832,125 | Intermodulation | 1 h 40 m |

Figure 6:
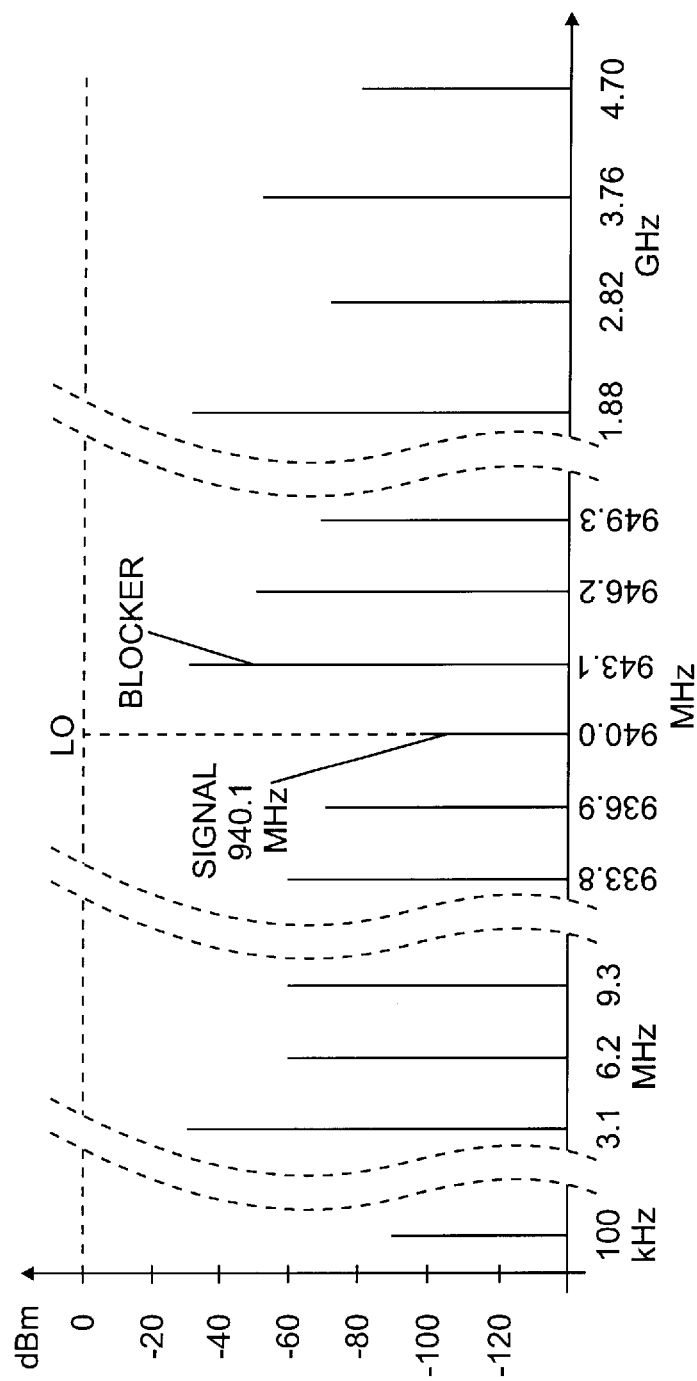
FIG. 6 illustrates a frequency plot resulting from analysis of an exemplary nonlinear circuit in accordance with the present invention.

FIG. 6 illustrates a spectral plot resulting from a blocking test simulation used to measure the desensitization of the above-described receiver front-end circuit. The LNA was driven with an RF input signal at −98 dBm and with a blocker signal at a frequency 3 MHz away from the input signal at a power level of −23 dBm. A third frequency was used for the LO. TABLE I indicates that the total transform size for this simulation was over 2000 and that the total number of unknowns was over 600,000. The size of the transform was attributable to the need to include a relatively large number of harmonics of the blocker and LO signals in order to prevent aliasing. The blocking test simulation required about three hours of computation time on a 150 MHz SGI R4400 system. The spectral plot of FIG. 6 shows one of the outputs of the front-end circuit during the blocking test, and was used to provide an indication of the reduction of the conversion gain in the presence of the blocker signal. Given the large number of frequencies involved, obtaining this information using conventional transient analysis would have required as much as one week of computation time. The computation times for the exemplary simulations performed in accordance with the present invention are listed in TABLE I.

The above-described embodiments of the invention are intended to be illustrative only. Numerous alternative embodiments may be devised by those skilled in the art without departing from the scope of the following claims.

What is claimed is:

1. A method for use in a computer for analyzing the operation of a device characterized under a set of operating conditions by a plurality of unknowns, based on a system of harmonic balance equations in which a plurality of spectral coefficients are used to represent each of the unknowns, the method comprising the steps of:

storing a compressed version of a matrix associated with the system of harmonic balance equations such that information generated from an inverse transform of a portion of the compressed version of the matrix can be used to solve a preconditioned linear system, wherein the linear system is based on an approximation of the matrix and is representative of the system of harmonic balance equations; and utilizing the information generated from the inverse transform of a portion of the compressed version of the matrix to solve the preconditioned linear system.

2. The method of claim 1 wherein the plurality of unknowns includes n unknown node spectra of the device, with each of the n unknown node spectra represented by N spectral coefficients.

3. The method of claim 1 wherein the matrix associated with the system of harmonic balance equations is a Jacobian matrix of the system of harmonic balance equations.

4. The method of claim 2 further including the steps of:
computing a residual of the system of harmonic balance equations using initial approximations of the N spectral coefficients for each of the n unknown node spectra;
if the residual is less than a predetermined constant, supplying the initial approximations of the N spectral coefficients for each of the n unknown node spectra as a solution of the system of harmonic balance equations; and
if the residual is not less than the predetermined constant, performing the storing and utilizing steps to solve the linear system, and generating an updated approximation of the N spectral coefficients for use in a subsequent iteration of the storing and utilizing steps.

5. The method of claim 3 wherein the storing step includes the steps of:
forming m sequences of length N using at least one block-diagonal matrix associated with the Jacobian matrix;
converting each of the m sequences to the frequency domain using a discrete Fourier transform, such that a set of Fourier coefficients are generated for each of the m sequences;
discarding the Fourier coefficients which fall below a threshold; and
storing the remaining Fourier coefficients as the compressed version of the Jacobian matrix.

6. The method of claim 2 wherein the utilizing step includes the steps of:
forming a preconditioner as an approximation of the matrix;
generating the preconditioned linear system by applying the preconditioner to a system including the matrix;
invoking a linear equation algorithm to solve the preconditioned linear system; and
terminating the linear equation algorithm when a sufficiently accurate solution of the preconditioned system is obtained.

7. The method of claim 6 further including the steps of:
computing updated approximations of the unknowns based on the solution of the preconditioned linear system;
computing a residual of the system of harmonic balance equations evaluated at the updated approximations;
supplying the updated approximations of the unknowns as a solution of the system of harmonic balance equations if the residual is less than a predetermined constant; and
repeating the storing and utilizing steps if the residual is not less than the predetermined constant.

8. The method of claim 1 wherein the utilizing step further includes the steps of:
utilizing a linear equation algorithm to solve the preconditioned linear system;
determining a magnitude of a particular vector entry in a set of vectors used by the linear equation algorithm; and
zeroing any entries of the set of vectors which have a magnitude less than a constant times the magnitude of the particular vector entry.

9. The method of claim 8 wherein the particular vector entry is the entry having the largest magnitude, and the constant is approximately $10^{-6}$.

10. The method of claim 8 wherein information regarding positions of zero entries in one of the vectors in the set of vectors is utilized by the linear equation algorithm for processing other vectors in the set.

11. The method of claim 1 further including the step of receiving user input including an indication of at least a subset of the operating conditions and at least a subset of the unknowns.

12. The method of claim 1 further including the step of displaying to a user the results of a simulation of the operation of the device under the set of operating conditions, based on a solution of the preconditioned linear system.

13. An apparatus for analyzing the operation of a device characterized under a set of operating conditions by a plurality of unknowns, the apparatus comprising:
a processor operative to perform computations based on a system of harmonic balance equations in which a plurality of spectral coefficients are used to represent each of the unknowns; and
a memory coupled to the processor and operative to store a compressed version of a matrix associated with the system of harmonic balance equations, such that the processor can utilize information generated from an inverse transform of a portion of the compressed version of the matrix to solve a preconditioned linear system which is based on an approximation of the matrix and is representative of the system of harmonic balance equations.

14. The apparatus of claim 13 wherein the plurality of unknowns includes n unknown node spectra of the device, with each of the n unknown node spectra represented by N spectral coefficients.

15. The apparatus of claim 13 wherein the matrix associated with the system of harmonic balance equations is a Jacobian matrix of the system of harmonic balance equations.

16. The apparatus of claim 14 wherein the processor is further operative to compute a residual of the system of harmonic balance equations using initial approximations of the N spectral coefficients for each of the n unknown node spectra, and if the residual is less than a predetermined constant, to supply the initial approximations of the N spectral coefficients for each of the n unknown node spectra as a solution of the system of harmonic balance equations, and if the residual is not less than the predetermined constant, to solve the preconditioned linear system and generate an updated approximation of the N spectral coefficients for use in a subsequent iteration.

17. The apparatus of claim 15 wherein the processor is further operative to generate the compressed version of the Jacobian matrix by forming m sequences of length N using at least one block-diagonal matrix associated with the Jacobian matrix, converting each of the m sequences to the frequency domain using a discrete Fourier transform, such that a set of Fourier coefficients are generated for each of the m sequences, discarding the Fourier coefficients which fall below a threshold, and storing the remaining Fourier coefficients as the compressed version of the Jacobian matrix.

18. The apparatus of claim 13 wherein the processor is further operative to form a preconditioner as an approximation of the matrix, to generate the preconditioned linear system by applying the preconditioner to a system including the matrix, to invoke a linear equation algorithm to solve the preconditioned linear system, and to terminate the linear equation algorithm when a sufficiently accurate solution of the preconditioned system is obtained.

19. The apparatus of claim 18 wherein the processor is further operative to compute updated approximations of the unknowns based on the solution of the preconditioned linear system, to compute a residual of the system of harmonic balance equations evaluated at the updated approximations, to supply the updated approximations of the unknowns as a solution of the system of harmonic balance equations if the residual is less than a predetermined constant, and to repeat the linear system solution process if the residual is not less than the predetermined constant.

20. The apparatus of claim 13 wherein the processor is further operative to utilize a linear equation algorithm to solve the preconditioned linear system, to determine a magnitude of a particular vector entry in a set of vectors used by the linear equation algorithm, and to zero any entries of the set of vectors which have a magnitude less than a constant times the magnitude of the particular vector entry.

21. The apparatus of claim 20 wherein the particular vector entry is the entry having the largest magnitude, and the constant is approximately $10^{-6}$.

22. The apparatus of claim 20 wherein information regarding positions of zero entries in one of the vectors in the set of vectors is utilized by the linear equation algorithm for processing other vectors in the set.

23. An apparatus for analyzing the operation of a device characterized under a set of operating conditions by a plurality of unknowns, based on a system of harmonic balance equations in which a plurality of spectral coefficients are used to represent each of the unknowns, the apparatus comprising:

means for storing a compressed version of a matrix associated with the system of harmonic balance equations, such that information generated from an inverse transform of a portion of the compressed version of the matrix can be used to solve a preconditioned linear system, wherein the linear system is based on an approximation of the matrix and is representative of the system of harmonic balance equations; and means for utilizing the information generated from the inverse transform of a portion of the compressed version of the matrix to solve the preconditioned linear system.

24. The apparatus of claim 23 wherein the means for storing a compressed version of a matrix and the means for utilizing the information are implemented as elements of a computer.

25. The apparatus of claim 23 wherein the plurality of unknowns includes n unknown node spectra of the device, with each of the n unknown node spectra represented by N spectral coefficients.

26. The apparatus of claim 23 wherein the matrix associated with the system of harmonic balance equations is a Jacobian matrix of the system of harmonic balance equations.

27. The apparatus of claim 26 further including:

means for forming m sequences of length N using at least one block-diagonal matrix associated with the Jacobian matrix;

means for converting each of the m sequences to the frequency domain using a discrete Fourier transform, such that a set of Fourier coefficients are generated for each of the m sequences;

means for discarding the Fourier coefficients which fall below a threshold; and means for storing the remaining Fourier coefficients as the compressed version of the Jacobian matrix.

28. The apparatus of claim 23 wherein the utilizing means further includes:

means for forming a preconditioner as an approximation of the matrix;

means for generating the preconditioned linear system by applying the preconditioner to a system including the matrix;

means for invoking a linear equation algorithm to solve the preconditioned linear system; and means for terminating the linear equation algorithm when a sufficiently accurate solution of the preconditioned system is obtained.

29. The apparatus of claim 28 further including:

means for computing updated approximations of the unknowns based on the solution of the preconditioned linear system;

means for computing a residual of the system of harmonic balance equations evaluated at the updated approximations;

means for supplying the updated approximations of the unknowns as a solution of the system of harmonic balance equations if the residual is less than a predetermined constant; and means for repeating the storing and utilizing steps if the residual is not less than the predetermined constant.

30. The apparatus of claim 23 wherein the utilizing means further includes:

means for utilizing a linear equation algorithm to solve the preconditioned linear system;

means for determining a magnitude of a particular vector entry in a set of vectors used by the linear equation algorithm; and means for zeroing any entries of the set of vectors which have a magnitude less than a constant times the magnitude of the particular vector entry.

31. The apparatus of claim 30 wherein the particular vector entry is the entry having the largest magnitude, and the constant is approximately $10^{-6}$.

32. The apparatus of claim 30 wherein information regarding positions of zero entries in one of the vectors in the set of vectors is utilized by the linear equation algorithm for processing other vectors in the set.

33. The apparatus of claim 23 further including means for receiving user input including an indication of at least a subset of the operating conditions and at least a subset of the unknowns.

34. The apparatus of claim 23 further including means for displaying to a user the results of a simulation of the operation of the device under the set of operating conditions, based on a solution of the preconditioned linear system.

35. A data structure for use in a computer for analyzing the operation of a device characterized under a set of operating conditions by a plurality of unknowns, based on a system of harmonic balance equations in which a plurality of spectral coefficients are used to represent each of the unknowns, the data structure comprising:

a compressed version of a matrix associated with the system of harmonic balance equations, wherein the compressed version of the matrix is configured such that information generated from an inverse transform of a portion of the compressed version of the matrix can be used to solve a preconditioned linear system, which is based on an approximation of the matrix and is representative of the system of harmonic balance equations, without decompressing the compressed version of the matrix.

36. The data structure of claim 35 wherein the plurality of unknowns includes n unknown node spectra of the device, with each of the n unknown node spectra represented by N spectral coefficients.

37. The data structure of claim 35 wherein the matrix associated with the system of harmonic balance equations is a Jacobian matrix of the system of harmonic balance equations.

38. The data structure of 37 wherein the compressed version of the Jacobian matrix includes only Fourier coefficients which are greater than a threshold, wherein the Fourier coefficients are generated by forming m sequences of length N using at least one block-diagonal matrix associated with the Jacobian matrix, and converting each of the m sequences to the frequency domain using a discrete Fourier transform.

* * * * *